US 9,922,863 B2

(12) United States Patent
Horino

(10) Patent No.: US 9,922,863 B2
(45) Date of Patent: Mar. 20, 2018

(54) SUSCEPTOR HAVING A HOLLOW IN ITS WALL FACING THE ORIENTATION FLAT OF A SEMICONDUCTOR WAFER

(71) Applicant: SUMITOMO ELECTRIC INDUSTRIES, LTD., Osaka-shi, Osaka (JP)

(72) Inventor: Kazuhiko Horino, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 356 days.

(21) Appl. No.: 14/444,464

(22) Filed: Jul. 28, 2014

(65) Prior Publication Data

US 2015/0027366 A1     Jan. 29, 2015

(30) Foreign Application Priority Data

Jul. 29, 2013   (JP) .................................. 2013-157065

(51) Int. Cl.
*H01L 21/687*      (2006.01)
*C23C 16/458*      (2006.01)

(52) U.S. Cl.
CPC .... *H01L 21/68735* (2013.01); *C23C 16/4585* (2013.01); *H01L 21/68785* (2013.01)

(58) Field of Classification Search
CPC ........ H01L 21/68735; H01L 21/68–21/68792; H01J 37/32715; C23C 16/4585
USPC ............................... 269/903, 900, 289 R, 21
See application file for complete search history.

(56) References Cited

U.S. PATENT DOCUMENTS

| 4,412,133 | A | * | 10/1983 | Eckes | ................. | H01L 21/6831 |
| | | | | | | 250/442.11 |
| 5,052,886 | A | * | 10/1991 | Moroi | ................. | H01L 21/6838 |
| | | | | | | 198/394 |
| 5,810,931 | A | * | 9/1998 | Stevens | ............. | H01L 21/68721 |
| | | | | | | 118/500 |
| 8,434,423 | B2 | * | 5/2013 | Toshima | ........... | H01L 21/67034 |
| | | | | | | 118/421 |
| 2013/0140274 | A1 | * | 6/2013 | Muffler | ................... | B44C 1/227 |
| | | | | | | 216/83 |
| 2015/0187627 | A1 | * | 7/2015 | Muffler | ................... | B44C 1/227 |
| | | | | | | 216/83 |
| 2015/0364352 | A1 | * | 12/2015 | Deshpande | ....... | H01L 21/67346 |
| | | | | | | 414/298 |

FOREIGN PATENT DOCUMENTS

| JP | 05-029230 | 2/1993 |
| JP | 2004-327761 | 11/2004 |
| JP | 2006-186105 | 7/2006 |

* cited by examiner

*Primary Examiner* — Karl Kurple
(74) *Attorney, Agent, or Firm* — Smith, Gambrell & Russell LLP

(57) ABSTRACT

A susceptor for securing a semiconductor wafer with an orientation flat within a pocket of the susceptor is disclosed. The pocket provides a first inner wall extending along the orientation flat and a second wall facing an arched periphery of the semiconductor wafer. The first inner wall provides a hollow extending outwardly from the first inner wall. The hollow can have a step, a slope, or a chamfered corner.

4 Claims, 11 Drawing Sheets

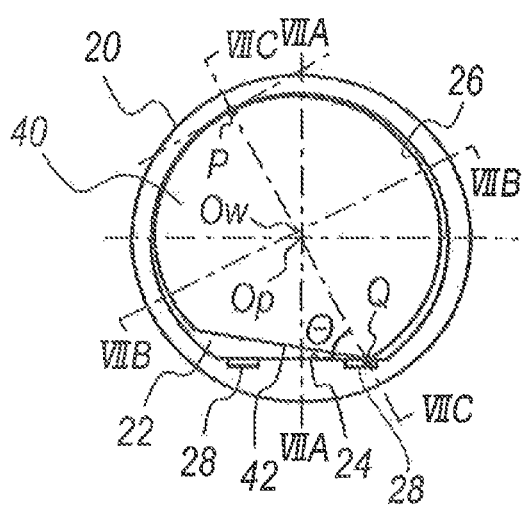
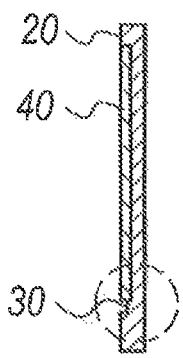
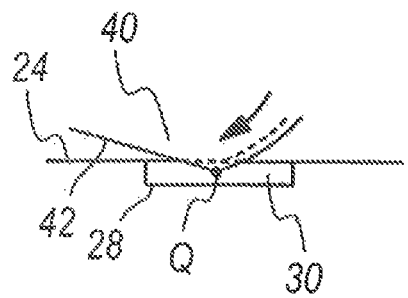
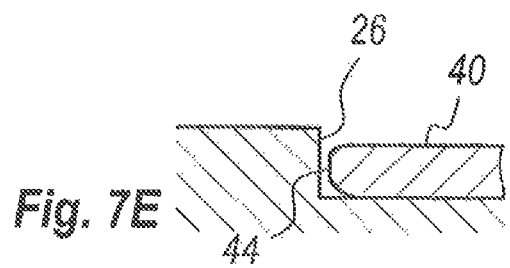

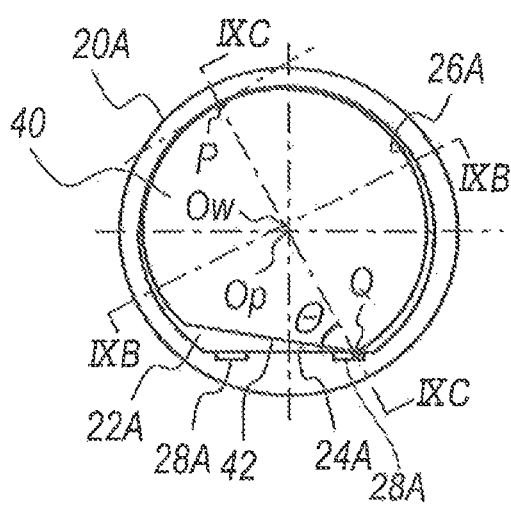
Fig. 9A
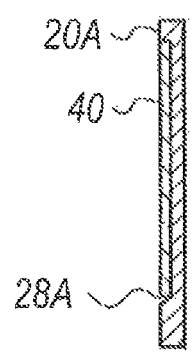
Fig. 9B
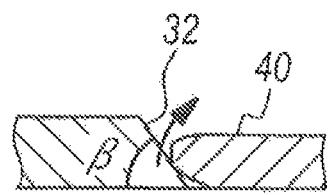
Fig. 9C
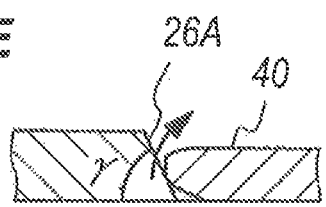
Fig. 9D
Fig. 9E

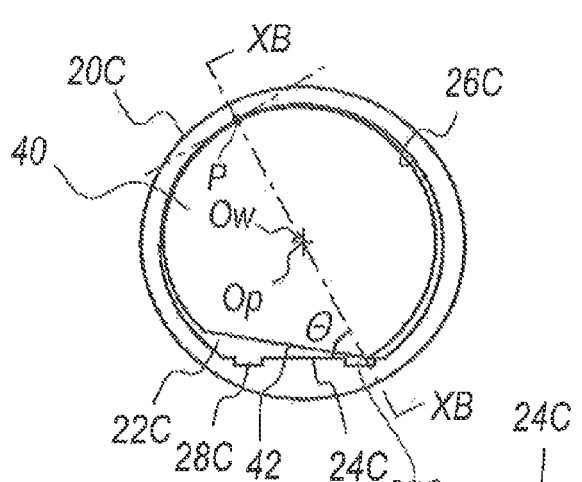
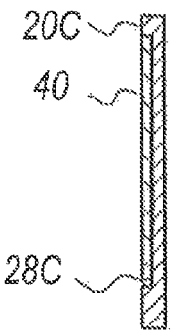
Fig. 10A
Fig. 10B
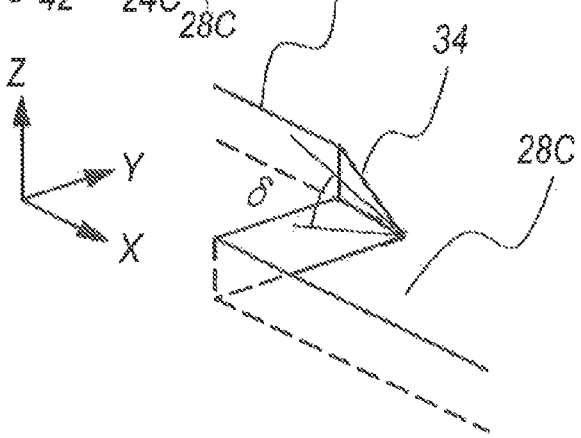
Fig. 10C
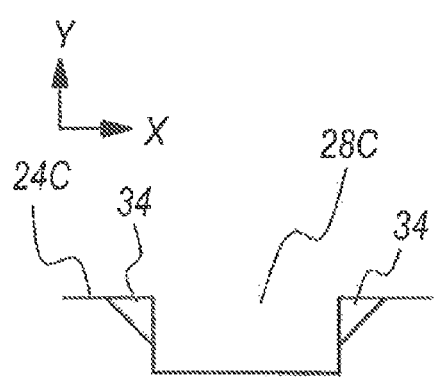
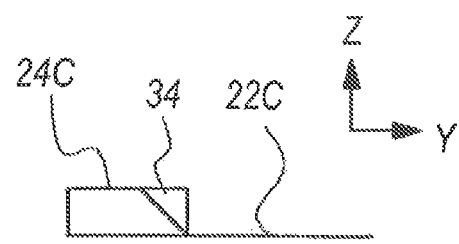
Fig. 10D
Fig. 10E

SUSCEPTOR HAVING A HOLLOW IN ITS WALL FACING THE ORIENTATION FLAT OF A SEMICONDUCTOR WAFER

BACKGROUND

1. Field of the Invention

The present application relates to a susceptor for securing a semiconductor wafer during a manufacturing process of the wafer.

2. Background Arts

The ordinary semiconductor process uses a susceptor for securing a semiconductor wafer during the practical process, such as the epitaxial growth of semiconductor layers, the deposition of an insulating film, a thermal treatment of the semiconductor wafer, and so on. The semiconductor wafer is set within a pocket of the susceptor. The pocket traces the outer shape of the semiconductor wafer, that is, the semiconductor wafer generally provides a circular plane shape with an identifier to identify the crystal orientation, which is called as the orientation flat (hereafter denoted as OF). The process for the semiconductor wafer is usually done as rotating and translating the susceptor. Various shapes of the pocket to resolve such subjects have been presented. However, prior arts have left the subject that the semiconductor wafer is sometimes hard to be lifted up or released from the pocket after the completion of the process because the semiconductor wafer rigidly comes in contact with the inner wall of the pocket.

SUMMARY

The present application relates to a susceptor used in the manufacturing process of the semiconductor wafer. The susceptor sets the semiconductor wafer within a pocket formed on a top surface thereof, where the semiconductor wafer has the OF and the arched periphery; while, the pocket in the outer shape thereof traces the outer periphery of the semiconductor wafer. That is, the pocket has the first inner wall facing the OF and the second inner wall facing the arched periphery of the semiconductor wafer. A feature of the susceptor of the present invention is that the first inner fall has a hollow extending outwardly, and the hollow provides one of a step, a slope, and a chamfered corner.

BRIEF DESCRIPTION OF THE DRAWINGS

The foregoing and other purposes, aspects and advantages will be better understood from the following detailed description of a preferred embodiment of the invention with reference to the drawings, in which:

FIGS. 7A to 7E illustrate a susceptor according to the first embodiment of the invention;

FIGS. 9A to 9E illustrate another susceptor according to the second embodiment of the present invention;

FIGS. 10A to 10E illustrate still another susceptor according to the third embodiment of the present invention.

DETAILED DESCRIPTION

Figure 1A:
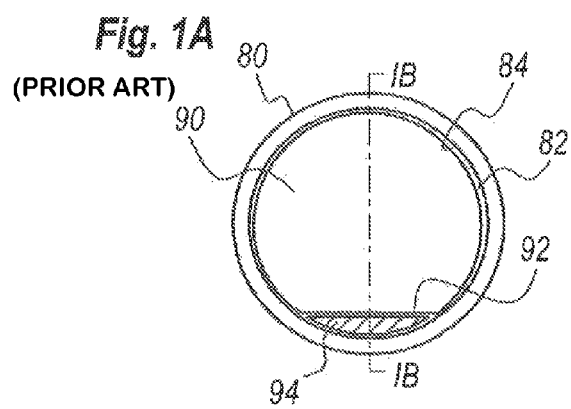
FIGS. 1A to 1D illustrate the first comparable example of a susceptor.
Figure 1B:
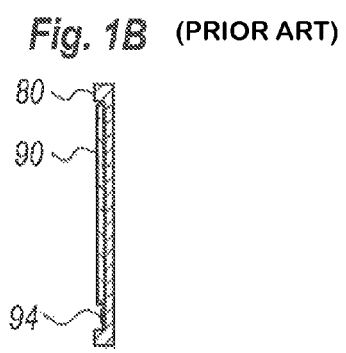
Figure 1C:
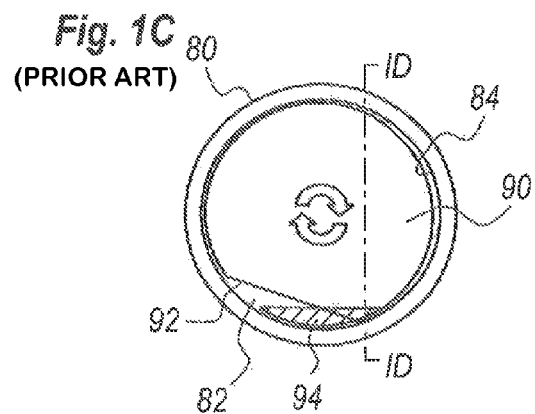
Figure 1D:
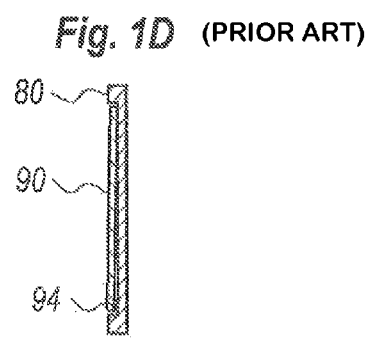

First, structures of a comparative susceptor will be described. FIGS. 1A and 1C are plan views of a comparative susceptor, while, FIGS. 1B and 1D are cross sections of the comparative susceptor taken along the lines, IB-IB and ID-ID, appearing FIGS. 1A and 1C, respectively.

The comparative susceptor 80, which provides a pocket 82, supports a semiconductor wafer 90 therein during the manufacturing process of a semiconductor device. The semiconductor wafer 90 generally provides an identifier to identify the crystal orientation of the wafer, which is called as the orientation flat (hereafter denoted as OF) 92. The wafer 90 has a circular plane shape except for the OF 92. The pocket 82 in the susceptor 80 also has a circular plane shape. The susceptor 80, being set in a processing apparatus, revolves and rotates to make the process performed for the wafer 90 uniform.

When the semiconductor wafer 90 with the OF 92 is set within in the pocket 82, to perform the process, such as the epitaxial growth of semiconductor layers on the wafer 90, a surplus deposition 94 possibly occurs on an area exposed between the OF 92 and the inner wall 84 of the pocket 82. As shown in FIGS. 1C and 1D, stopping the rotation of the susceptor 80, the wafer 90 in the pocket 82 sometimes runs on the surplus deposition 94 due to the inertial rotation, which may degrade the uniform temperature distribution within the wafer 90, cases unintentional minute particles, and so on.

Figure 2A:
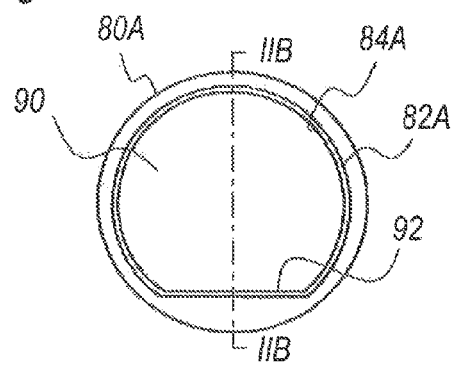
FIGS. 2A to 2E illustrate the second comparable example of a susceptor.
Figure 2B:
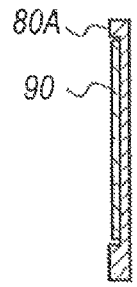
Figure 2C:
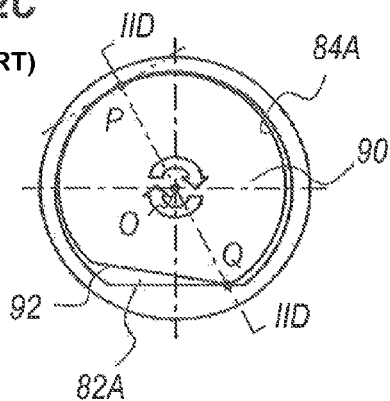
Figure 2D:
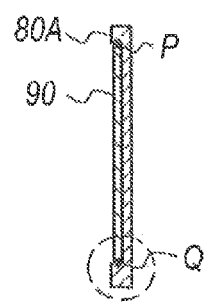
Figure 2E:
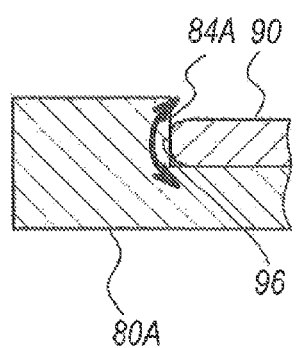

FIGS. 2A to 2E show structures of another comparative susceptor, where FIGS. 2A and 2C are plan views thereof, while, FIGS. 2B and 2D are cross sections taken along the line, IIB-IIB and IID-IID, appearing in FIGS. 2A and 2C, respectively; and FIG. 2E magnifies a portion of FIG. 2D where the wafer 90 is in contact with an inner wall 84A of the pocket 82A.

The comparative susceptor 80A shown in FIGS. 2A and 2C have the modified pocket 82A whose plane shape traces the outer shape of the wafer 90, which may remove the exposed space between the OF 92 and the inner wall 84A of the pocket 82A and effectively suppress the surplus deposition on the exposed space.

However, as illustrated in FIGS. 2C and 2D, the comparable susceptor 80A does not provide a mechanism to prevent the wafer 90 from moving by inertial force, which often the wafer 90 abuts the corner Q of the OF 92 against the inner wall 84A of the pocket 82A. In FIGS. 2C and 2D, the corner Q and a point P opposite to the corner Q with respect to the center O of the wafer 90 come in contact with the inner wall 84A. Because the line PQ passes the center O, the wafer 90 and the inner wall 84A have the common tangent line at the point P, which effectively prevents the wafer 90 from rotating by the point Q as the center of the rotation. Moreover, as illustrated in FIG. 2E, the wafer 90 has a flat periphery edge 96 to be in contact with the inner wall 84A, which restricts the up and down motion of the wafer 90 by the point P as the center of the motion. Thus, when the wafer 90 set within the pocket 82A comes in contact with the corner Q, the wafer 90 is necessary to be manipulated to release from the pocket 82A. However, even the soft manipulation of the wafer 90 possibly causes chippings and breakings. In particular, when the susceptor 80 and the wafer 90 has a larger difference in respective thermal expansion co-efficient, the fitting the wafer 90 within the pocket 82A to be hard to manipulate the wafer 90 up from the pocket 82A tends to occur.

Figure 3A:
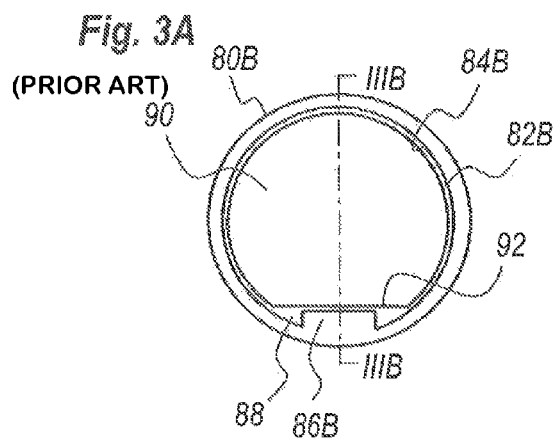
FIGS. 3A to 3E illustrate the third comparable example of a susceptor.
Figure 3B:
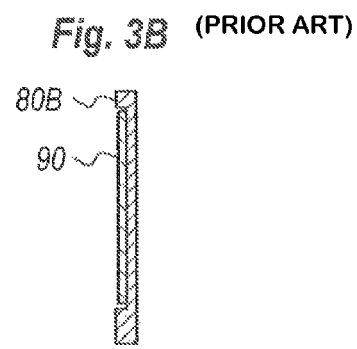
Figure 3C:
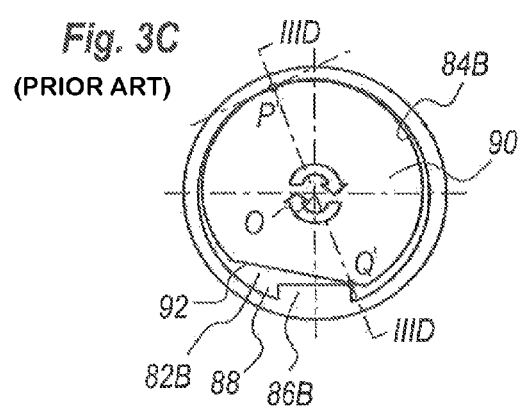
Figure 3D:
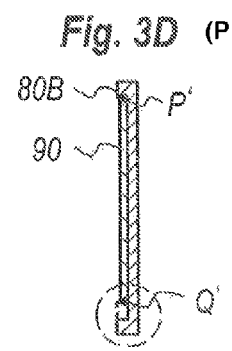
Figure 3E:
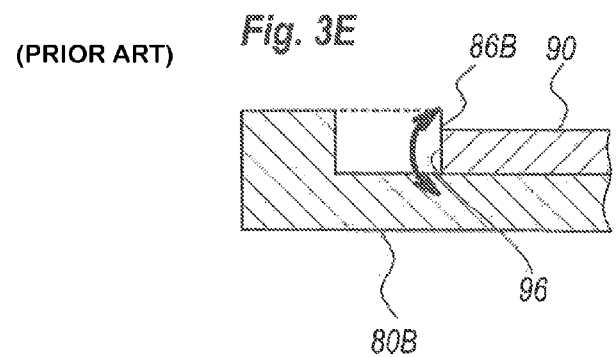

FIGS. 3A to 3E show still another comparable susceptor 80B. FIGS. 3A and 3C are the plane view, while, FIGS. 3B and 3D are cross sections taken along the lines, IIIB-IIIB and IIID-IIID, appearing in FIGS. 3A and 3C, respectively, and FIG. 3E is also a cross section magnifying a portion shown in FIG. 3D.

The comparable susceptor 80B shown in FIGS. 3A and 3C provides a projection 86B in the inner wall 84B of the pocket 82B. The projection 86B, which extends along the OF 92 set in the pocket 82B, forms exposed portions 88 in both sides thereof. The projection 86B is for preventing the OF 92 in the corner Q thereof from coming in contact with the projection 86B. Thus, the exposed portions 88 may effective facilitate to manipulate the wafer.

However, the susceptor 80B shown in FIGS. 3A to 3E leaves the subject that the point Q' is in contact with the corner of the projection 86B, and the point P' opposite to the point Q' with respect to the center O of the wafer 90 is also in contact with the inner wall 84B of the pocket 82B. Also, the subject where the periphery edge 96 of the wafer 90 is widely in contact with the inner wall of the projection 86B. Both contacts of the points Q' and P' make it hard to release the wafer 90 from the pocket 82B of the susceptor 80B.

Figure 4A:
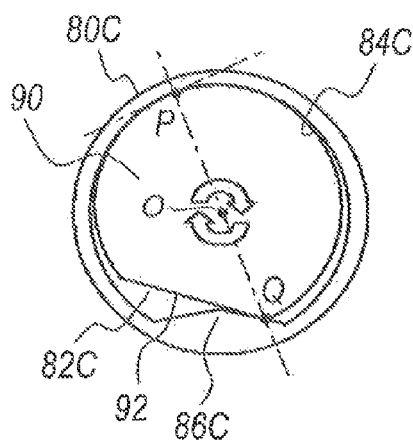
FIGS. 4A to 4D illustrate susceptors modified from the susceptor of the third comparable example shown in FIGS. 3A to 3E.
Figure 4B:
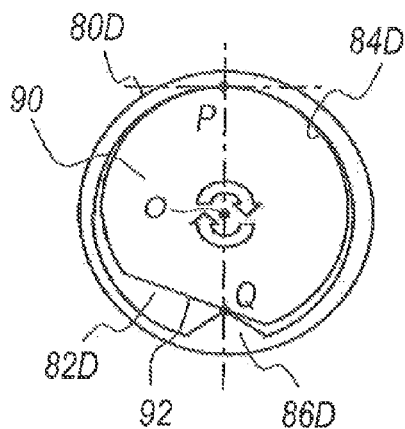
Figure 4C:
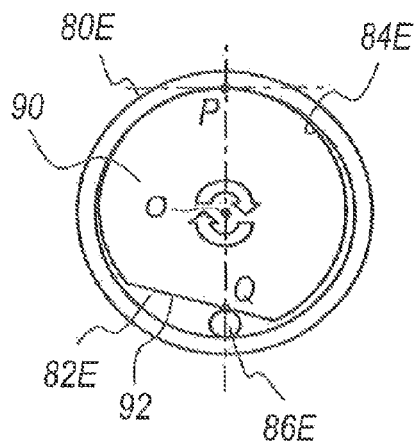
Figure 4D:
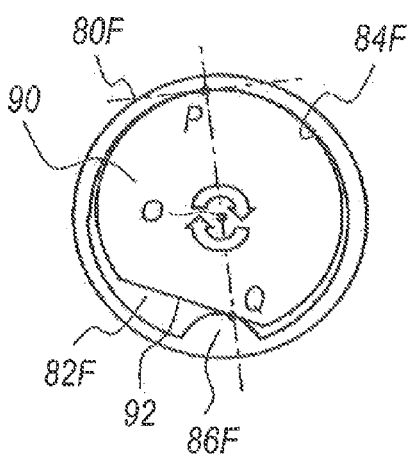

FIGS. 4A to 4D show modifications of the susceptor 80B shown in FIGS. 3A to 3E, in particular, the modified susceptors 80C to 80F provide specific projections 86C to 86F in the pocket. Specifically, the susceptor 80C of FIG. 4A provides a projection 86C with a triangular plane shape that comes in contact with the edge of the OF 92; the susceptor 80D in FIG. 4B also has a triangular projection 86D but comes in contact with the OF 92 in a point; the susceptor 80E in FIG. 4C has a projection 86E with a circular plane shape; and the susceptor 80F in FIG. 4D provides a projection 86F with a rounded plane shape. Even in those susceptors, 80C to 80F, the wafer 90 possibly comes in contact with two points, Q and P, one Q is at an edge of the OF 92, and the other P is a point opposite to the point Q with respect to the center O of the wafer.

Figure 5A:
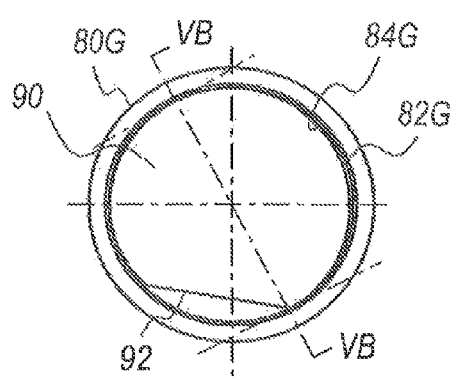
FIGS. 5A to 5E illustrate the fourth comparable example of a susceptor.
Figure 5B:
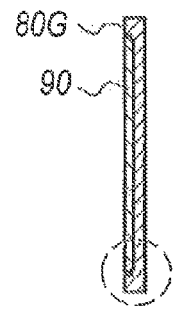
Figure 5C:
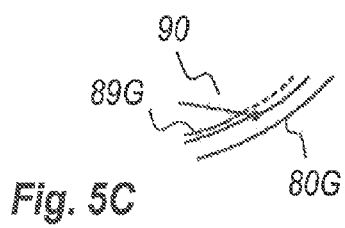
Figure 5D:
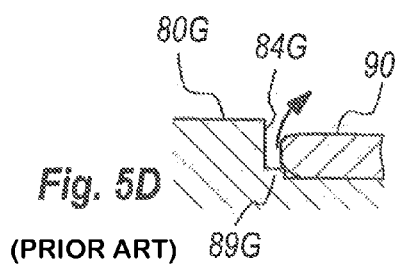
Figure 5E:
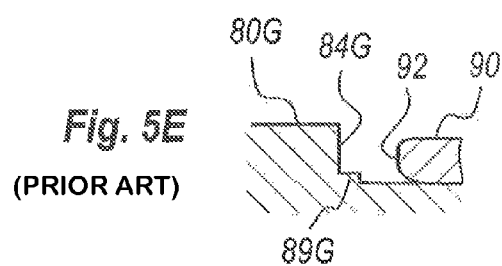

FIGS. 5A to 5E show still another comparable example of a susceptor, where FIG. 5A is a plan view, FIG. 5B shows a cross section taken along the line VB-VB appearing in FIG. 5A, FIG. 5C magnifies a corner portion of the OF, FIG. 5D shows a cross section of the corner portion along the line VB-VB, and FIG. 5E shows magnified cross section of a portion close to the OF.

The susceptor of the present comparable example provides a step 89G along the inner wall 84G of the pocket 82G. As shown in FIG. 5D, the step 89G may prevent the semiconductor wafer 90 from making in direct contact with the inner wall 84G. Moreover, even when the semiconductor wafer 90 with a chamfered edge comes in contact with the step 89G, a gap is formed between the inner wall 84G and the peripheral edge 92 of the wafer 90, which facilitates for the wafer 90 to lift up from the pocket 82G. However, the step 89G expands the gap between the peripheral edge 92 of the wafer and the inner wall 84G, which enhances the surplus deposition within the gap.

Thus, comparable susceptors, 80 to 80G, are hard to make the suppression of the surplus deposition consistent with the suppression of the fitting of the wafer within the pocket. Next, some embodiments of the present invention will be described, where the embodiments solve two subjects described above.

First Embodiment

Figure 6:
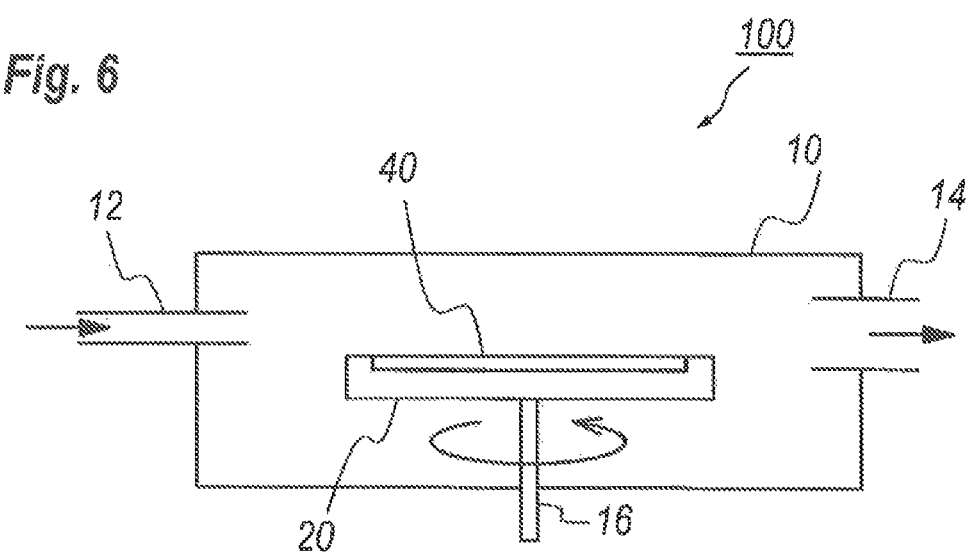
FIG. 6 schematically illustrates an apparatus implementing with a susceptor according to the first embodiment of the present invention.

FIG. 6 schematically illustrates an apparatus for the semiconductor wafer process according to the first embodiment of the invention. The present embodiment concentrates on an apparatus to deposit an insulating film on a semiconductor wafer; however, the invention is easily converted to other type of apparatuses such as an apparatus to grow semiconductor layers epitaxially, an apparatus to grow metal films, and so on. The apparatus 100 of the embodiment includes a chamber 10 to isolate the inside thereof from an ambient. The chamber 10 provides an inlet 12 to introduce source materials within the chamber 10 and an outlet 14 to discharge the chamber 10. The chamber 10 also provides a susceptor 20 supported by support 16, where the susceptor 20 sets a semiconductor wafer 40 in a pocket 22 therein. The susceptor 20 may rotate by rotating the support 16. During the rotation of the susceptor 20, the wafer 40 set within the pocket 22 also rotates, which makes the process performed on the wafer 40 uniform.

The susceptor 20, which secures the semiconductor wafer 40 during the process in the chamber 10, provides the pocket 22. The susceptor 20 may be made of carbon (C), carbon coated with silicon carbide (SiC), sintered aluminum nitride (AlN), sintered SiC, and so on. The semiconductor wafer 40 is, for instance, Si, InP, SiC, GaAs, GaN, and so on.

FIGS. 7A to 7E show a susceptor 20 according to the first embodiment of the invention, where FIG. 7A is a plan view, FIG. 7B is a cross section taken along the line VIIC-VIIC appearing in FIG. 7A, FIGS. 7C and 7D magnify a corner of the OF 42 of the wafer 40, and FIG. 7E magnifies a cross section taken along the line VIIB-VIIB appearing in FIG. 7A.

As shown in FIG. 7A, the pocket 22 receives the semiconductor wafer 40 providing the OF 42. The inner wall of the pocket 22 provides the first inner wall 24 extending along the OF 42 and the second wall 26 except for the first inner wall 24. The first inner wall 24 locates inner compared with the second wall 26. The first inner wall 24 provides two hollows 28 whose positions are symmetry with the center VIIA-VIIA of the pocket 22.

FIG. 7A schematically illustrates a status of the wafer 40 moving in rotation and/or translation by an inertia force after the stop of the rotation of the susceptor 20, which is comparable with a state shown in FIG. 2C. In FIG. 7A, the center of the wafer 40 is denoted as Ow, while, that of the pocket 22 is denoted as Op. The wafer 40, similar to the wafer 90 shown in FIG. 2C, comes in contact with the pocket 22 at the corner Q of the OF 42 and the other point P opposite to the point Q with respect to the center Qw of the wafer 40. In this status, the line VIIC-VIIC connecting two points, P and Q, passes the center Ow of the wafer 40 and the wafer 40 is hard to be rotated by the point P as the center of the rotation.

As shown in FIG. 7D, the hollows 28 provide respective steps 30 with a height smaller than a thickness of the wafer 40, which facilitates the wafer 40 to ride on the step 30 combined with the chamfered edge of the wafer 40, In other words, the hollow 28 has a depth shallower than a depth of the pocket from the step 30. This arrangement of the hollow 28 with the step 30 enables to release the wafer 40 from the pocket 22, or lift the wafer 40 up from the pocket 22 by the point P as the center, even when the wafer 40 comes in contact with the pocket 22 at two points, P and Q. Also, as shown in FIG. 7E, the second wall 26 of the pocket 22 provides no hollows 28, which exposes no or extremely narrow areas for the surplus deposition.

Thus, the susceptor 20 of the first embodiment provides two inner walls, 24 and 26, the former of which extends along the OF 42 of the wafer 40 and provides the hollow 28 with the step 30. This arrangement may effectively suppress the wafer 40 from falling within the pocket 22 and being hard to release therefrom even when the susceptor 20 and the wafer 40 have respective thermal expansion coefficients widely different from others. Also, the inner wall 26 of the pocket 22 has no hollow 28 with the step 30, that is, the inner wall 26 except for the portion of the hollow has no hollows or the step, which effectively suppresses the surplus deposition within the gap between the peripheral edge 44 of the wafer 40 and the second wall 26 compared with the structures shown in FIGS. 2 and 5.

Next, dimensions of the pocket 22 will be described in detail.

Figure 8A:
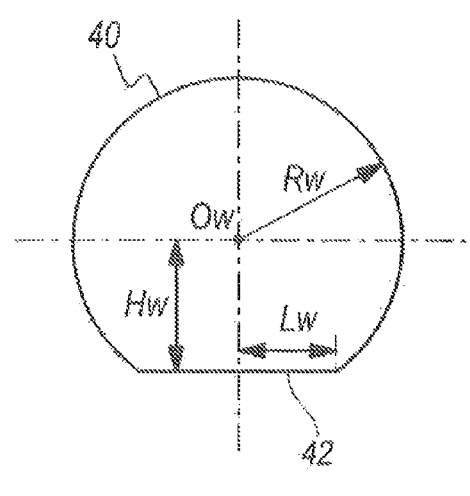
FIGS. 8A to 8D explain in detail the hollow provided in the susceptor of the first embodiment shown in FIGS. 7A to 7E.
Figure 8B:
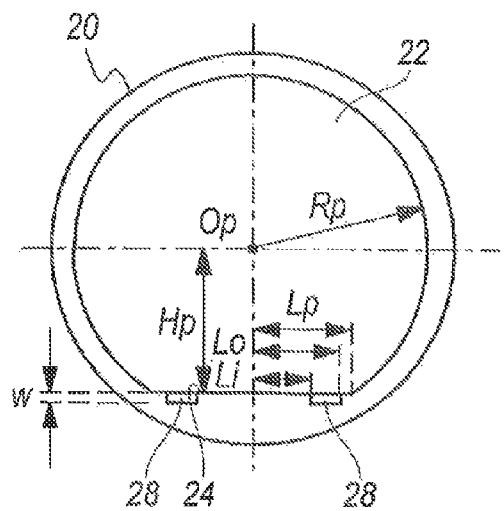
Figure 8C:
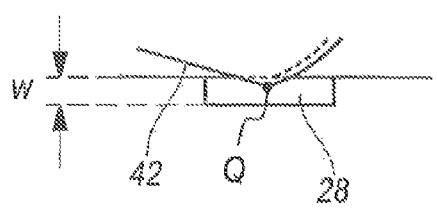
Figure 8D:
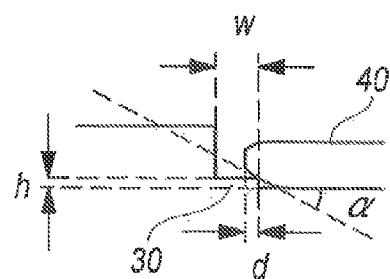

FIGS. 8A to 8D show details of the pocket 22, where FIG. 8A is a plan view of the semiconductor wafer 40; FIG. 8B is a plan view of the pocket 22; FIG. 8C magnifies corner portion of the OF 42 and the hollow 28; and FIG. 8D shows a cross section of the corner portion shown in FIG. 8C. In these figures, some symbols to denote structural elements are omitted.

The semiconductor wafer 40, as shown in FIG. 8A, has a radius Rw, a length Hw from the center Ow to the OF 42, a length Lw from a point, at which the normal of the OF 42 passes the center Ow, to the corner of the OF 42, that is, the length Lw is a half of the length of the OF 42. Similarly, the pocket 22 has a radius Rp, a length Hp from the center Op to the first inner wall 24, and a length Li from a cross point, at which the normal of the first inner wall 24 passes the center Op, to the closer edge of the hollow 28, a length Lo from the cross point to a far edge of the hollow 28, and a length Lp from the cross point to the corner of the first inner wall 24. Further, as shown in FIG. 8D, the step 30 in the hollow 28 has a height h, and the wafer 40 has a length d in the chamfered edge, specifically, a length from the peripheral edge 44 to a point at which the chamfered edge comes in contact with the edge of the step 30. The angle of the tangent line of the chamfered edge, at which the chamfered edge comes in contact with the edge of the step 30, is α.

Conditions to set the semiconductor wafer 40 within the pocket 22 are:

$$Rp > Rw, \quad (1)$$

and $$(Rp+Hp) > (Rw+Hw), \quad (2)$$

Further assuming a length L1 from the cross point for the lengths, Li, Lo, and Lp, to a point at which the corner of the OF 42 comes in contact with the step 30; a condition for the corner of the OF 42 touches the step 30 is given by:

$$(2 \times Rw - Rp - d)^2 = Hp^2 + L1^2. \quad (3)$$

Setting another length L2 from the cross point to a point where the corner of the OF 42 is in contact with the first inner wall 24, another condition for the point outside of the hollow 28 is given by:

$$(2 \times Rw - Rp)^2 = Hp^2 + L2^2. \quad (4)$$

Accordingly, the hollow 28 is necessary to be formed in conditions of:

$$Li < L1, \quad (5)$$

and $$Lo > L2, \quad (6)$$

As shown in FIG. 7A, setting an angle between the line VIIC-VIIC passing two points, P and Q, and the first inner wall 24 is θ; the width w of the step is necessary to be:

$$w > d \times \sin\theta, \quad (7)$$

The angle θ may be also denoted as:

$$\tan\theta = Hp/L1. \quad (8)$$

Taking a scattering of the radii Rw of the wafer 40 into account, that is, the radios Rw of the wafer 40 is from Rwmin to Rwmax, equations (3) and (4) above are rewritten as:

$$(2 \times Rw\text{min} - Rp - d)^2 = Hp^2 + L1^2, \quad (9)$$

and $$(2 \times Rw\text{max} - Rp)^2 = Hp^2 + L2^2, \quad (10)$$

respectively. Assuming the length L1 derived from equation (9) above to be L1min and the length L2 derived from equation (10) to be L2max; then, equations (5) and (6) are rewritten as:

$$Li < L1\text{min}, \quad (11)$$

and $$Lo > L2\text{max}, \quad (12)$$

respectively.

Inserting equations (9) and (11) into equations (11) and (12), the position of the hollow 28 is given by:

$$Li < \sqrt{((2 \times Rw\text{min} - Rp - d)^2 - Hp^2)}, \quad (13)$$

and $$Lo > \sqrt{((2 \times Rw\text{max} - Rp)^2 - Hp^2)}, \quad (14)$$

respectively. Or, the hollow 28 is necessary to be formed in the closer edge and the far edge so as to satisfy the relations given by equations (13) and (14). In addition, the length of the hollow 28, which is equal to (Lo−Li), is preferably to be short enough to suppress the circulation of the source gas to the back surface of the wafer 40. Specifically, when the OF 42 has the length Lf, the width of the hollow 28 is preferably to satisfy the condition of:

$$Lo - Li < Lf/4. \quad (15)$$

As for the height h of the step 30, the step 30 preferably has the height h less than a half thickness of the semiconductor wafer 40. Taking the angular velocity of the susceptor 20 into account, the height h of the step is preferable given by the equation of:

$$h >= Rw/500, \quad (16)$$

for an angular velocity of about π/10 [rad/sec], where the radius Rw of the wafer 40 has a dimension of milli-meter. For the angle α of the tangent of the chamfered edge where the chamfered edge comes in contact with the edge of the step 30, which is shown in FIG. 8D, the angle α is preferably to satisfy the conditions of:

$$10° <= \alpha <= 80°, \quad (17)$$

or the angle α further preferably satisfies the conditions of:

$$30°<=\alpha<=60°. \quad (18)$$

Such conditions of the angle α, namely, the chamfered edge of the wafer 40 may effectively suppress the wafer 40 from being fallen within the pocket 22 and in a status hard to release the wafer 40 from the pocket 22.

In the first embodiment above described, the pocket 22 provides a pair of hollows 28 in bilateral symmetry positions in the first inner wall 24. However, the pocket 22 may provide a single hollow 28. The condition, where the wafer 40 falls within the pocket 22 and becomes hard to release therefrom, possibly occurs in the beginning and the stopping of the rotation of the susceptor 20. The inertial rotation of the wafer 40 is opposite in the direction thereof for the beginning and the stopping. Accordingly, the first inner wall 24 preferably provides a pair of hollows 28 in positions bilaterally symmetry to each other.

Second Embodiment

The second embodiment of the susceptor according to the present invention modifies the shape of the hollow 28.

FIGS. 9A to 9E schematically illustrates the susceptor 20A according to the second embodiment, where FIG. 9A is a plan view; FIG. 9B shows a cross section taken along the line IXC-IXC appearing in FIG. 9A; FIG. 9C magnifies a corner portion of the OF 42; FIG. 9D shows a cross section of the corner portion also take along the line IXD-IXD; and FIG. 9E shows a cross section taken along the line IXE-IXE appearing in FIG. 9C.

The hollow 28A of the susceptor 20A according to the second embodiment, as shown in FIGS. 9C to 9E, provides a slope 32 inclined inwardly of the susceptor 20A in the hollow 28A. The wafer 40 may be released or lifted up from the pocket 22A as the chamfered edge thereof comes in contact with the slope 32. The arrangement of the slope 32 and the edge of the wafer 40 facilitates to release or lift up the wafer 40 from the pocket 22A even when the wafer 40 and the pocket 22B come in contact with each other at two points, P and Q, which extremely suppress the degree of freedom to move laterally.

An angle β of the slope 32 against the pocket 22A, similar to the angle α shown in FIG. 8D, preferably satisfies the relation of $10°<=\beta<=80°$, further preferably $30°<=\beta<=60°$. In order to realize this condition, the angle γ of the slope 32 formed in the inner wall 26A of the pocket 22A. FIG. 9E shows a cross section taken along the line IXE-IXE appearing in FIG. 9C. That is, the inner wall 26A of the pocket 22A except for the edge 24A corresponding to the OF 42 is inclined inwardly so as to form the slope as shown in FIG. 9E. Assuming the angle of the inner wall 26A to be γ, three angles of β, γ, and θ have the following relation:

$$\tan \beta = \cos \theta \times \tan \gamma, \quad (19)$$

Then, the angle β of the slope 32 may be adjusted.

Thus, the susceptor 20A of the second embodiment, similar to the aforementioned susceptor 20, may effectively prevent the wafer 40 from being fallen within the pocket 22A and hard to release lift up from the pocket 22A. The present embodiment of the susceptor 20A provides the slope 32 formed in a flat plane. However, as far as the angle thereof, exactly, the angle of the tangent at the point where the peripheral edge of the wafer 40 comes in contact to, satisfies the range described above, the slope 32 may be a curved surface, and so on.

Third Embodiment

The third embodiment of the susceptor according to the present invention modifies the second embodiment shown in FIG. 9A. FIG. 10A is a plan view of the susceptor 20C of the third embodiment on which the wafer 40 is set within the pocket 22C; FIG. 10B shows a cross section taken along line XB-XB appearing in FIG. 10A; FIG. 10C is a perspective view of a side portion of the hollow 28C; and FIGS. 10D and 10E are plan and side views of the hollow 28C.

As shown in FIG. 10C, the corner between the hollow 28C and the inner wall 24C of the susceptor 20C according to the present embodiment is chamfered to form a slope 34, where the slope 34 extends from the bottom of the pocket 22C to the top edge of the inner wall 24C and has an angle of δ with respect to the bottom of the pocket 22C.

According to the third embodiment of the susceptor 20C, even when the wafer 40 is fallen within the pocket 22C, the OF 42, in particular, the end of the OF 42 may come in contact with the slope 34, which may easily lift up or release the wafer 40 from the pocket 22C. Similarly, when the wafer 40 comes in contact with the inner wall 26C at the point P opposite to the OF 42, the wafer 40 may be easily lifted up or released from the pocket 22C. The angle δ of the slope 34, same as the angles α and β in the aforementioned embodiments, preferably satisfies the relation of $10°<=\delta<=80°$, or further preferably, $30°<=\delta<=60°$.

The embodiment shown in FIGS. 10A to 10E has the slope 34 extending from the bottom of the pocket 22C. However, the slope 34 extending at least to the corner of the chamfered edge of the wafer 40 may show the same function to lift up or release the wafer 40 from the pocket 22C. The slope 34 extending to the bottom of the pocket 22C does not choose the types or shapes of the wafer 40. Moreover, the hollow 28C of the present embodiment exposes the bottom of the pocket 22C. However, the hollow 28C may provide another slope shown in the aforementioned embodiment.

Fourth Embodiment

Figure 11A:
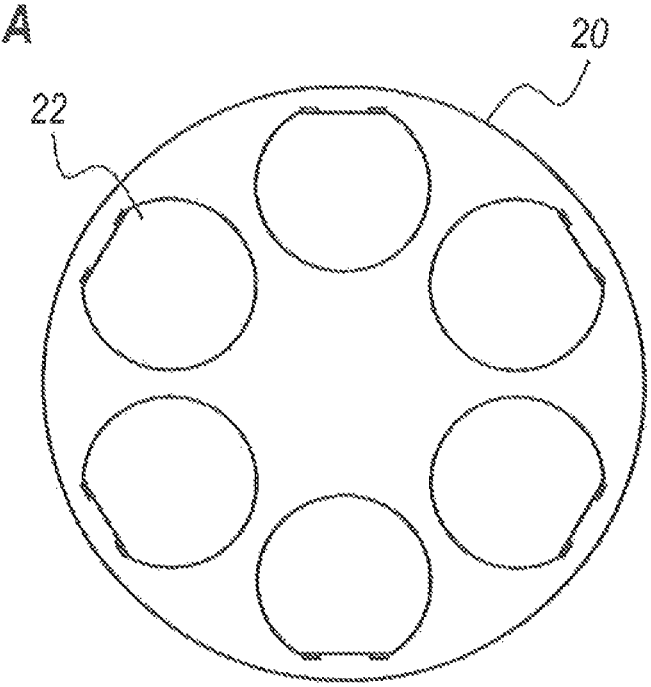
FIGS. 11A and 11B schematically illustrate apparatuses implementing with susceptors of the first to third embodiments.
Figure 11B:
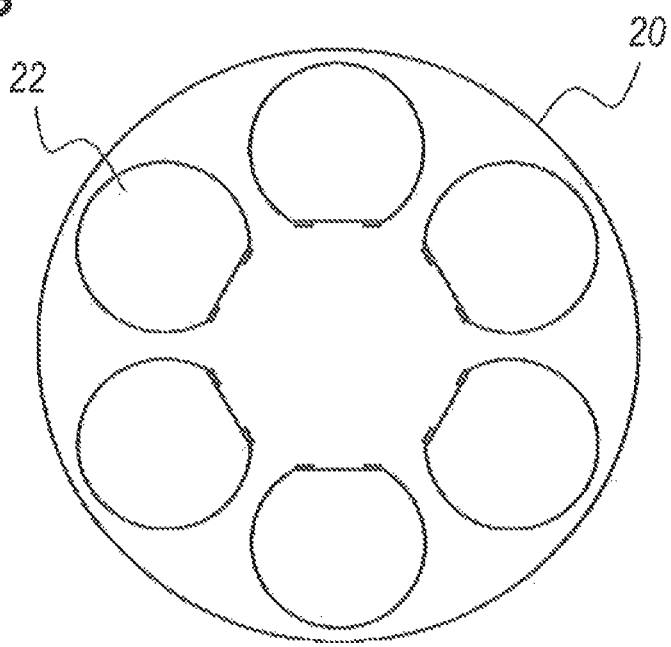

The fourth embodiment of the present invention relates to an apparatus implementing with a plurality of the pockets thus described. FIGS. 11A and 11B are plan views of the pockets 22 arranged within the susceptor 20. The pockets 22 each have the arrangement of one of the first to third embodiments. The pockets 22 illustrated in FIG. 11A turn the hollows outwardly, while, the pockets 22 shown in FIG. 11B turn the hollows inwardly.

The wafers 40 set within the pockets 22 of the susceptor 20 shown in FIGS. 11A and 11B are possibly fallen within respective pockets 22. However, respective pockets 22 provide the aforementioned structures shown in FIGS. 8 to 10, the wafers may be easily lifted up or released from the pockets 22 without causing surplus deposition on the bottom of the pocket 22.

The aforementioned embodiments concentrate on the susceptors implemented within the apparatus 100 to grow semiconductor layers on the wafer 40. However, the susceptors of the embodiments may be used in other types of the apparatus, for instance, that for the chemical vapor deposition (CVD), that for the thermal treatment of the wafer, and so on. Accordingly, the appended claims are intended to encompass all such modifications and changes as fall within the true spirit and scope of this invention.

What is claimed is:

1. A susceptor configured to set a semiconductor wafer thereon, the wafer having an upper surface, a lower surface, a thickness between the upper and lower surfaces, an orientation flat, and an arched periphery, the susceptor comprising:

a first inner wall, a second inner wall, and a bottom that define a pocket of the susceptor, the first inner wall facing the orientation flat of the semiconductor wafer, the second inner wall facing the arched periphery of the wafer, and the bottom surface supporting the lower surface of the wafer, the first inner wall having a center and a hollow extending outwardly from the center of the first inner wall, wherein the hollow has a step with a height less than the thickness of the semiconductor wafer, and wherein the hollow satisfies relations of:

$$Li < \sqrt{((2 \times Rw - Rp - d)^2 - Hp^2)},$$

$$Lo > \sqrt{((2 \times Rw - Rp)^2 - Hp^2)}, \text{ and}$$

$$(Lo - Li) < Lf/4,$$

where Li is a length from the center of the first inner wall to an edge of the hollow that is closer to the center, Lo is a length from the center of the first inner wall to another edge of the hollow that is farther from the center of the first inner wall than the edge of the hollow, Lf is a length of the orientation flat, Rw is a radius of the semiconductor wafer, Rp is a radius of the pocket measured in the second inner wall, Hp is a length from a center of the pocket to the first inner wall, and d is a depth where the semiconductor wafer in an end of the orientation flat penetrates within the hollow.

2. The susceptor of claim 1, wherein the first inner wall has another hollow to provide a pair of hollows, each hollow being formed in a position in the first inner wall so that the hollows are symmetrical with respect to the center of the first inner wall, and wherein the another hollow satisfies the relations:

$$Li < \sqrt{((2 \times Rw - Rp - d)^2 - Hp^2)},$$

$$Lo > \sqrt{((2 \times Rw - Rp)^2 - Hp^2)}, \text{ and}$$

$$(Lo - Li) < Lf/4.$$

3. The susceptor of claim 1, wherein the semiconductor wafer has a chamfered periphery defining a tangent line, and wherein the step has a corner abutting against the chamfered periphery on the tangent line, the tangent line forming an angle with respect to the bottom of the pocket that is greater than or equal to 10° but less than or equal to 80°.

4. The susceptor of claim 1, wherein the semiconductor wafer has a chamfered periphery, and wherein the step has a height greater than or equal to Rw/500.

* * * * *